US011476376B2

(12) United States Patent
Vawter et al.

(10) Patent No.: US 11,476,376 B2
(45) Date of Patent: Oct. 18, 2022

(54) PHOTOVOLTAIC ARRAY FOR A POWER-BY-LIGHT SYSTEM

(71) Applicant: National Technology & Engineering Solutions of Sandia, LLC, Albuquerque, NM (US)

(72) Inventors: Gregory A. Vawter, Corrales, NM (US); Erik J. Skogen, Tijeras, NM (US); Charles Alford, Albuquerque, NM (US); Junoh Choi, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 60 days.

(21) Appl. No.: 16/366,942

(22) Filed: Mar. 27, 2019

(65) Prior Publication Data

US 2019/0305164 A1 Oct. 3, 2019

Related U.S. Application Data

(60) Provisional application No. 62/769,376, filed on Nov. 19, 2018, provisional application No. 62/649,365, filed on Mar. 28, 2018.

(51) Int. Cl.
*H01L 31/05* (2014.01)
*H01L 31/0304* (2006.01)
*H01L 31/054* (2014.01)
*H01L 31/0443* (2014.01)
(Continued)

(52) U.S. Cl.
CPC .... *H01L 31/0504* (2013.01); *H01L 31/03044* (2013.01); *H01L 31/03046* (2013.01); *H01L 31/0443* (2014.12); *H01L 31/054* (2014.12); *H01L 31/075* (2013.01); *H02J 50/30* (2016.02)

(58) Field of Classification Search
CPC . H01L 31/547; H01L 31/549; H01L 31/0735; H01L 31/046; H01L 31/0465; H01L 31/0443; H01L 31/054; H01L 31/042
See application file for complete search history.

(56) References Cited

U.S. PATENT DOCUMENTS 6,265,653 B1 * 7/2001 Haigh ................ H01L 31/0475
 136/244
6,399,873 B1 * 6/2002 Sano .................... H01L 31/202
 136/249
(Continued)

OTHER PUBLICATIONS

Fukuda, M., Optical Semiconductor Devices, John Wiley & Sons, Inc, 1999, pp. 220-221.
(Continued)

*Primary Examiner* — Eli S Mekhlin
(74) *Attorney, Agent, or Firm* — Kevin W. Bieg (57) ABSTRACT

A hybrid-integrated series/parallel-connected photovoltaic diode array employs 10s-to-100s of single-wavelength III-V compound semiconductor photodiodes in an array bonded onto a transparent optical plate through which the array is illuminated by monochromatic light. The power-by-light system receiver enables high-voltage, up to 1000s of volts, optical transmission of power to remote electrical systems in harsh environments.

21 Claims, 11 Drawing Sheets

(51) Int. Cl.
*H01L 31/075* (2012.01)
*H02J 50/30* (2016.01)

(56) References Cited

U.S. PATENT DOCUMENTS

| | | | | |
|---|---|---|---|---|
| 2001/0023702 | A1* | 9/2001 | Nakagawa | H01L 31/042 136/244 |
| 2002/0139411 | A1* | 10/2002 | Hiraishi | H01L 31/048 136/244 |
| 2003/0160251 | A1* | 8/2003 | Wanlass | H01L 31/0475 257/80 |
| 2005/0253213 | A1* | 11/2005 | Jiang | H01L 27/14618 257/433 |
| 2006/0048811 | A1* | 3/2006 | Krut | H01L 31/109 136/249 |
| 2007/0137698 | A1* | 6/2007 | Wanlass | H01L 25/0756 136/261 |
| 2008/0053518 | A1* | 3/2008 | Chang | H01L 31/022466 136/252 |
| 2010/0186818 | A1* | 7/2010 | Okorogu | H01L 31/0547 136/259 |
| 2012/0150364 | A1* | 6/2012 | Tillotson | G05D 1/101 701/3 |
| 2013/0133730 | A1* | 5/2013 | Pan | H01L 31/035236 136/255 |
| 2014/0353584 | A1* | 12/2014 | Fujii | H01L 31/1844 257/21 |
| 2016/0225928 | A1* | 8/2016 | Woods | H01L 31/072 |
| 2017/0200841 | A1* | 7/2017 | Yoshikawa | H01L 31/03046 |
| 2018/0254356 | A1* | 9/2018 | Yao | H01L 31/02005 |

OTHER PUBLICATIONS

Streetman, B.G. and Banerjee, S., Solid State Electronic Devices, Fifth Edition, Prentice Hall, 2000, pp. 382-385.

* cited by examiner

PHOTOVOLTAIC ARRAY FOR A POWER-BY-LIGHT SYSTEM

CROSS-REFERENCE TO RELATED APPLICATIONS

This application claims the benefit of U.S. Provisional Application No. 62/649,365, filed Mar. 28, 2018, and U.S. Provisional Application No. 62/769,376, filed Nov. 19, 2018, both of which are incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to power-by-light systems and, in particular, to a compact and efficient photovoltaic array that enables optical power-by-light delivery in a very small form factor compact package.

BACKGROUND OF THE INVENTION

Power-by-light systems (also known as power-over-fiber) rely on the transmission of monochromatic laser or light emitting diode (LED) light via an optical fiber or free space (i.e., wireless) to a receiver, where it is converted back into electricity by a photovoltaic (PV) diode(s) to supply electronics. These systems have the advantage of galvanically isolating the optical power supply from the PV receiver, since these subsystems are electrically disconnected from each other. This electrical isolation is particularly advantageous where large electromagnetic fields exist, since the optical transmission is inherently free from electromagnetic noise and interference (EMI), in contrast to conventional systems based on copper wiring. In particular, the electrical isolation between subsystems sensitive to undesired transient high voltages, such as lightning strikes or charged particle collection in orbit, has been a driver for fiber-optical distribution of electrical power using laser diodes and single-wavelength photovoltaics. Such power-by-light systems also have safety advantages in systems exposed to explosion hazards that may be susceptible to sparking danger. The use of a monochromatic light source enables the efficient conversion of light back into electricity using III-V semiconductor PV diodes designed to operate at a single wavelength with high source intensities, unlike solar cell applications which suffer from efficiency losses due to the broadband nature of solar radiation. However, a drawback of III-V PV diodes is their low output voltage (e.g., 1 V), which is often insufficient to power electronic circuits directly. Fortunately, it is possible to boost the output voltage and current with series-parallel connection of PV diodes. Delivering power-by-light has been used commercially in applications such as underwater robots, high voltage, and strong magnetic field environments. These systems typically deliver ~24V DC with a volume of several 10s of cubic-inches but are not designed for harsh space environments. While such systems have been commercially successful, existing power-by-light receivers lack the compact size, capability to deliver 100s or 1000s of volts, and efficiency needed for advanced space systems. Attempts have been made to build monolithic series PV cells from GaAs PV diodes but leakage currents in the lower semi-insulating GaAs substrate have prevented attainment of high voltages (e.g., >60 V). Therefore, a need remains for a power-by-light system that can provide efficient high-voltage operation in a compact package.

SUMMARY OF THE INVENTION

The present invention is directed to a power-by-light receiver comprising 10s-to-1000s of III-V semiconductor single wavelength hybrid-integrated series/parallel-connected photodiodes bonded onto an optically transparent substrate. The hybrid-integrated III-V PV array can operate at high voltage under monochromatic illumination from the transparent substrate side. Any direct bandgap III-V compound semiconductor system can be used, including GaAs, (AlGa)As, GaAs/InGaP, or GaN. The total thickness of the III-V semiconductor diode stack can be less than 10 micrometers. Sapphire is a preferred substrate, since it is optically transparent to monochromatic light over a broad range of wavelengths and is chemically inert to standard microfabrication processes. However, any rigid, electrically insulating substrate that is transparent to the monochromatic light can be used, including glass, fused silica, polycarbonate, or GaN. An optimized series/parallel photovoltaic array enables high-voltage, up to 1000s of volts, optical power delivery to remote systems in harsh environments.

BRIEF DESCRIPTION OF THE DRAWINGS

The detailed description will refer to the following drawings, wherein like elements are referred to by like numbers.

DETAILED DESCRIPTION OF THE INVENTION

Figure 1:
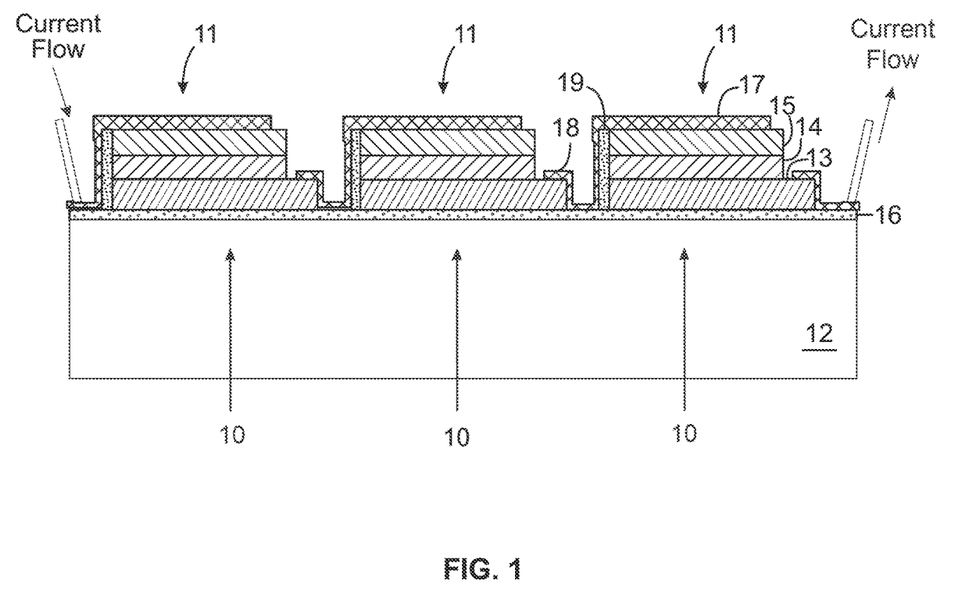
FIG. 1 is a side-view schematic illustration of an exemplary hybrid wafer-bonded PV diode array. Illumination of the array is shown as through the transparent substrate and onto the bonded side of the diode array.

According to the present invention, an as-grown III-V PV diode array is mounted onto a highly-insulating, optically transparent substrate, thereby enabling optical transmission of input monochromatic light through the substrate and high-voltage electrical output from the illuminated PV array. An exemplary PV diode array is shown in FIG. 1. Monochromatic laser or LED light 10 is incident on the array of PV diodes 11 from the bottom-side (e.g., the n-side) bonded to an optically transparent substrate 12. Illumination of the PV array through the transparent substrate 12 eliminates blocking of light by the top-side metal contacts. Light passes through the n-type window layer 13 (e.g., n-(AlGa)As) to an absorber layer 14. The absorber layer 14 can comprise undoped intrinsic GaAs. The top layer 15 of the photodiode can be a p-type GaAs layer.

As an example, fabrication of the PIN photodiode can begin with epitaxially growing the compound semiconductor layers on a GaAs growth substrate, starting with a thin InGaP release layer followed by a p-type GaAs layer 15, an undoped i-GaAs absorber layer 14, and an n-type lattice-matched (AlGa)As window layer 13. The window-side of the as-grown PV epitaxy can then be bonded to a sapphire support substrate 12 using a transparent benzocyclobutene (BCB) polymer layer 16. For example, the BCB polymer layer 16 can be from 50 nm to 1 µm thick. BCB has the useful property of limited plastic flow during the bonding process, enabling bonding onto diodes with non-planar features, such as etched trenches. The original GaAs growth substrate can then be removed with a combination of mechanical lapping and selective wet chemical etching. See F. Niklaus et al., "Adhesive wafer bonding," J. Appl. Phys. 99, 031101 (2006). The exposed surface after the growth substrate removal is the p-type GaAs. Conventional lithography and etching procedures can then be used to form the diode array and interconnect metallization. As shown in FIG. 1, the p-side ohmic contact 17 covers nearly the entire top side of the diode 11 while the n-side contact 18 is to an exposed edge of the n-type window layer 13 and insulated from the diode layers by a thin vertical dielectric layer 19 (e.g., silicon nitride). Metallization between diodes can connect the n-side of one diode to the p-side of the next diode, creating a series diode configuration.

Figure 2A:
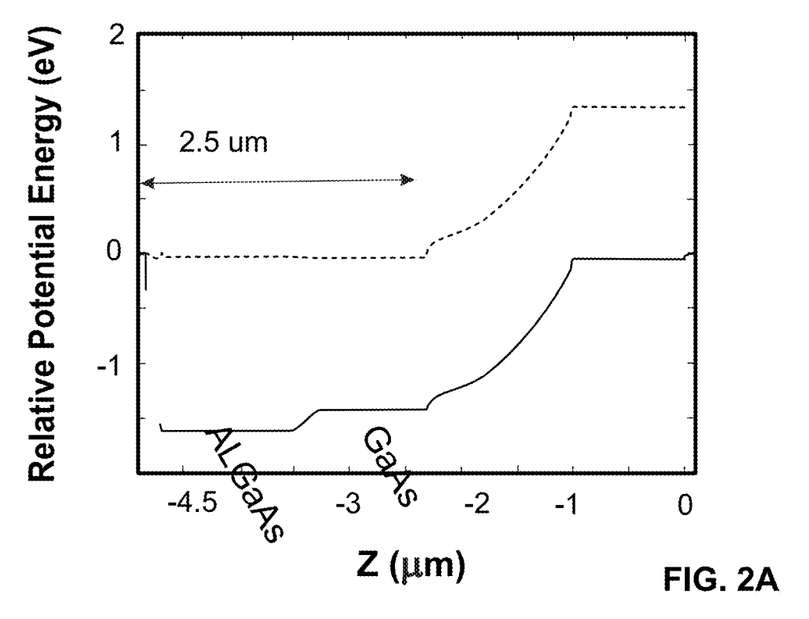
FIG. 2A is an illustration of the band structure for a diode with an n-type AlGaAs/GaAs window bilayer.
Figure 2B:
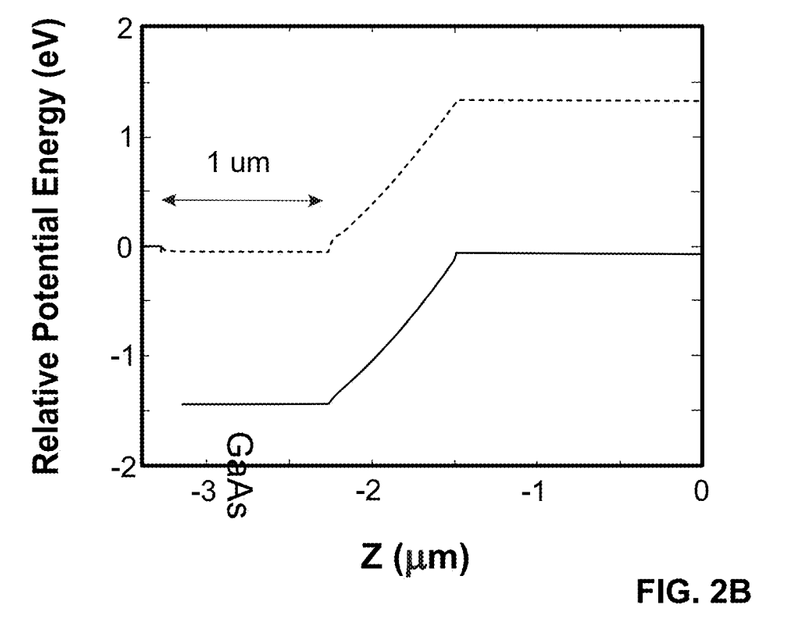
FIG. 2B is an illustration of the band structure for an all GaAs diode comprising a n-type GaAs window layer.

The n-type (AlGa)As window layer can comprise a variety of structures, including a uniform AlGaAs layer, a graded AlGaAs/GaAs layer, an AlGaAs/GaAs bilayer, or a GaAs layer providing an all GaAs diode. Since AlGaAs has a wider bandgap than GaAs, the band structure of the n-type (AlGa)As window layer can be used to control where the photocarriers are generated in the layer stack and thereby keep carrier generation away from the bonded interface, where surface recombination can occur, and near enough to the i-GaAs absorber layer that the carriers will readily diffuse to the edge of the i-GaAs absorber at which point they are swept across by the built-in electric field within the i-GaAs absorber. Preferably, the GaAs portion of the (AlGa) As window layer is less than one-hole diffusion length thick (e.g., less than one micrometer) to enable the holes to diffuse to the undoped region and be swept across the diode and participate as photocurrent. The band structure can also be engineered to assure current is readily conducted sideways along the n-type window layer, with thicker layers preferred to reduce resistance to transverse current flow. The band structure of an n-type AlGaAs/GaAs bilayer, with a thin graded layer between the two layers, is shown in FIG. 2A. The total thickness of the window layer is about 2.5 µm. The band structure for an all GaAs diode is shown in FIG. 2B. The thickness of the window layer is about 1 µm. Other binary, ternary, and quaternary III-V semiconductor materials, such as InGaP, can also be used. Finally, the semiconductor layers can be grown in reverse, making the p-side the bottom side. However, p-type GaAs may have a higher resistivity, making it more difficult to conduct current laterally from under the diode.

Figure 3:
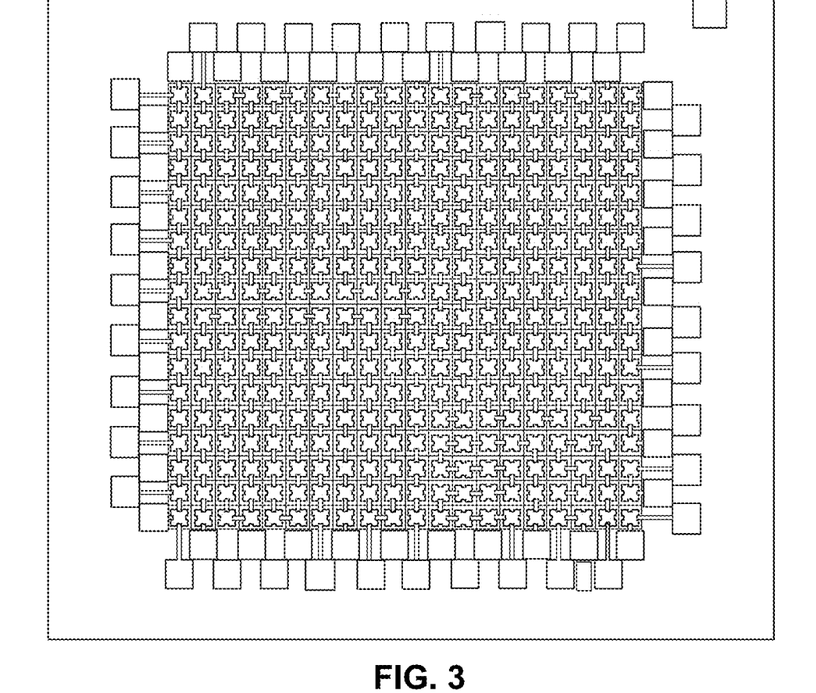
FIG. 3 is a top-view illustration of a completed 20×20 diode array. The dark squares are the individual diodes.
Figure 4:
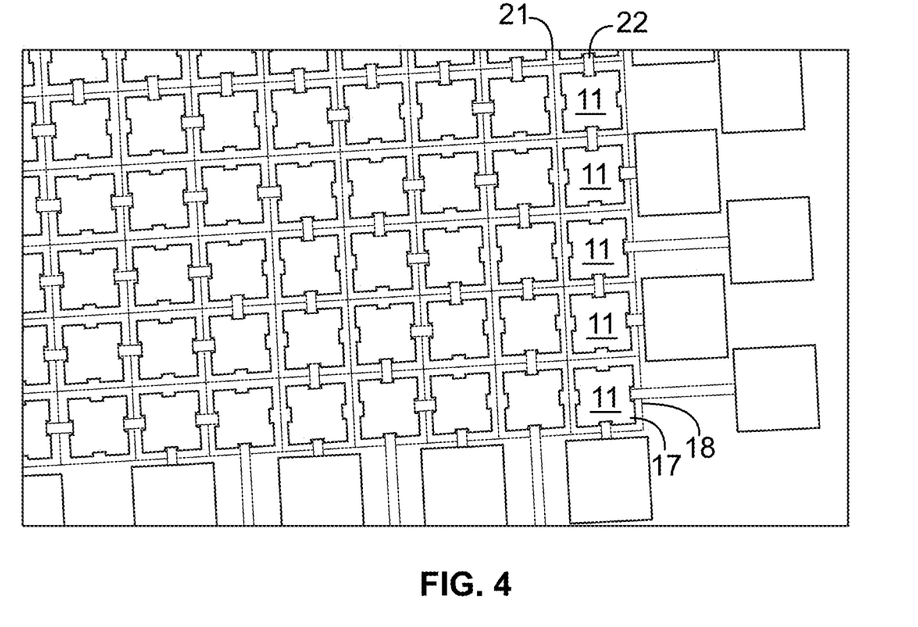
FIG. 4 is a larger magnification top-view image of the diode array clearly showing the individual PV diodes and their electrical interconnection.

As an example of the invention, a PV diode array was designed and fabricated that was capable of optical-to-electrical power conversion via illumination with 808 nm wavelength light. Selection of 808 nm light allows for a near ideal combination of 808-nm high power-diode lasers, for efficient electrical-to-optical power conversion, and single-junction direct-band-gap GaAs photovoltaic diodes, for efficient optical-to-electrical power back conversion. See R. Pena and C. Algora, "Semiconductor materials for photovoltaic converters applied to power-by-light systems," in 2005 Spanish Conference on Electron Devices, pp. 291-294 (2005). Initially, all-GaAs PV arrays were designed and fabricated to operate at an optical intensity of 1e5 mW/cm$^2$ while generating a photocurrent density of 62.5 A/cm$^2$. At this current density, a 100 µm square diode will generate 6.3 mA photocurrent. PV diode arrays were fabricated with individual square diodes ranging in size from 65 to 185 µm. A 4 mm×4 mm array size provides a 20×20 square set of identically-sized diodes. In FIG. 3 is shown a top-view illustration of a completed 20×20 diode array as viewed from the diode side (i.e., illumination is from the opposite side of the illustration). FIG. 4 shows a close-up top-view image of a small corner of this array, in which the structure of the PV array is apparent. The p-contact 17 is the larger gold square feature in the middle of each individual diode while the n-contact 18 wraps around the edge of the diode mesa. The thin line separating diodes 11 is a deep-etched trench 21 exposing the sapphire substrate 12 and electrically isolating the individual diodes 11. Also visible are the narrower metallic interconnect lines 22 connecting one diode to the next in the desired series PV circuit. The square "tabbed" configuration of diodes enables series/parallel diodes circuits within the array. Proper wiring of these series/parallel circuits enables robust operation, even under non-uniform illumination. See A. L. Lentine et al., "Optimal cell connections for improved shading, reliability, and spectral performance of microsystem enabled photovoltaic (MEPV) modules," in 2010 35*th IEEE Photovoltaic Specialists Conference*, 2010, pp. 003048-003054.

Figure 5:
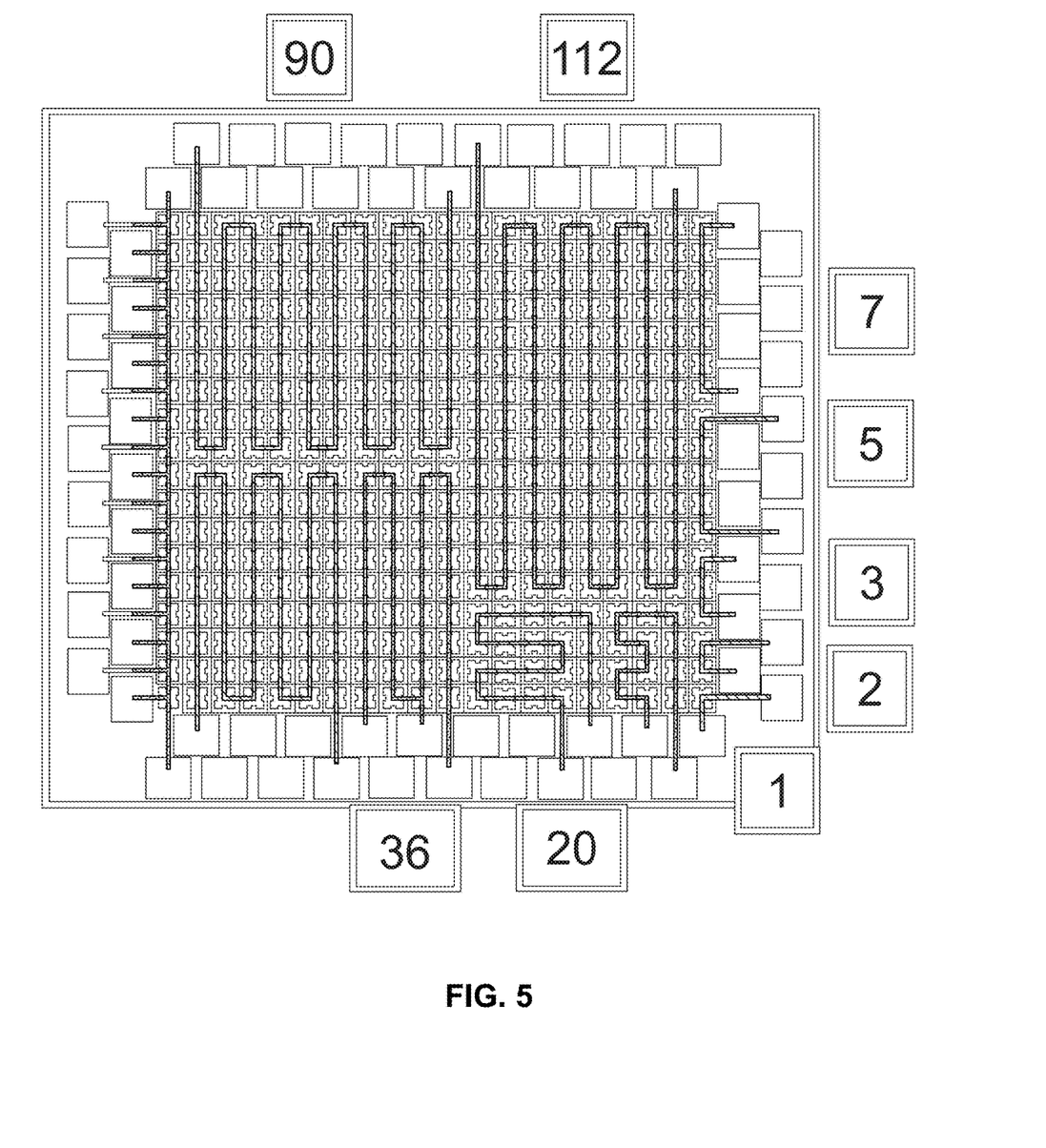
FIG. 5 is a top-view illustration showing the diode series connection layout of the array. The serpentine lines trace the electrical current path of the separate series diode chains embedded in the 20×20 overall diode array. The numbers on the edges of the array indicate the length of the series diode chains tested in FIG. 6.
Figure 6:
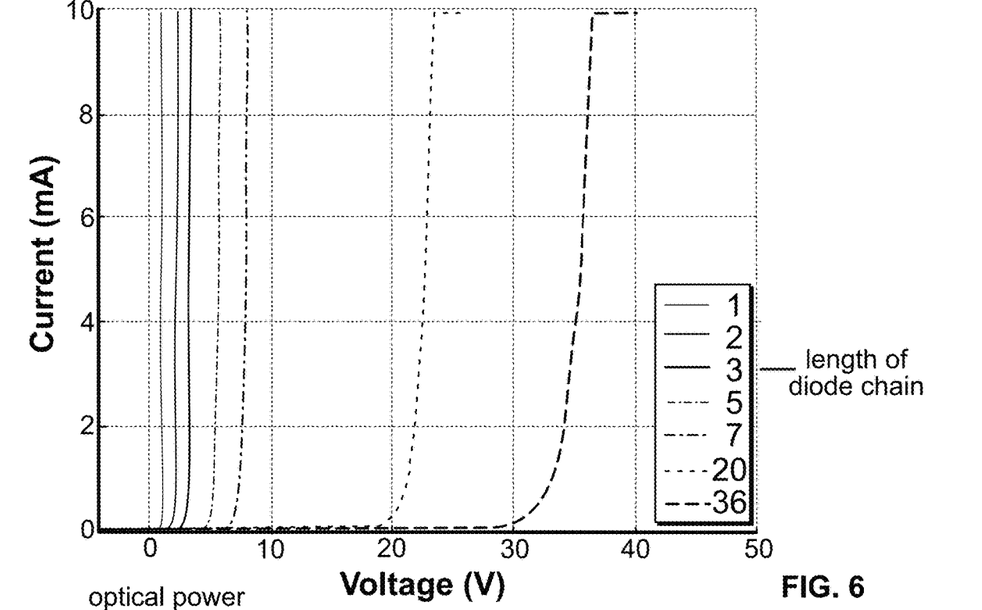
FIG. 6 is a graph of current versus voltage for non-illuminated series PV arrays. The legend indicates the length of the series chain.
Figure 7:
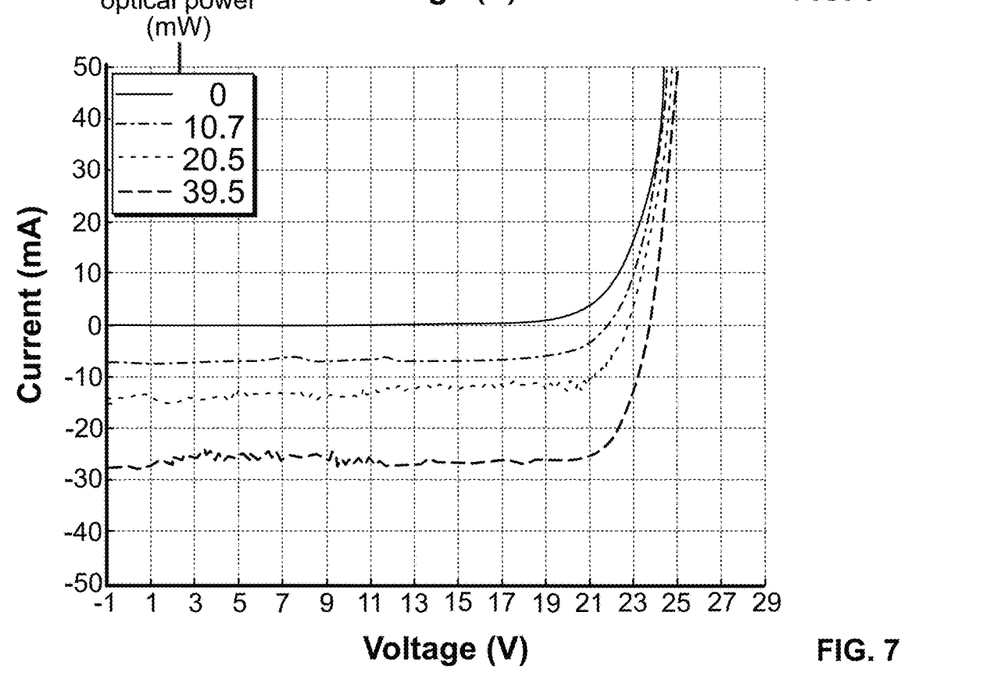
FIG. 7 is a graph of current versus voltage for an illuminated series PV chain of 36 diodes. The legend indicates the incident optical power in mW. Note that, for these tests, the optical beam significantly overfilled the diode chain.

FIG. 5 shows an array constructed as a set of serial diode chains of varying length and arranged as serpentine patterns within the 20×20 diode array. These serpentine patterns have chain lengths of between 1 and 112 diodes. Stacking the PV diodes in series sums the voltages at the output. FIG. 6 shows data for non-illuminated operation of series chains of up to 36 diodes. Each diode was 141 μm across. The diode chains were tested using an electrical source-measurement unit (SMU) by sweeping the applied voltage across the chain and measuring the current flow. The maximum tested chain length was limited only by the voltage limit of the SMU used. The data show the voltage stacking behavior, with 1 diode flowing 6 mA at 1 V and 36 diodes flowing 6 mA at 36 V. The diode array was then mounted in an illuminated stage and bias voltage swept as before. The laser wavelength was 808 nm. The current of the chain is proportional to the light power incident on the chain. The data in FIG. 7 shows that the 36-diode GaAs series chain operates at >25 μA at up to 21 V forward bias with 39.5 mW of incident light power. The optical conversion efficiency can be >0.6 NW of light incident on a diode.

Figure 8A:
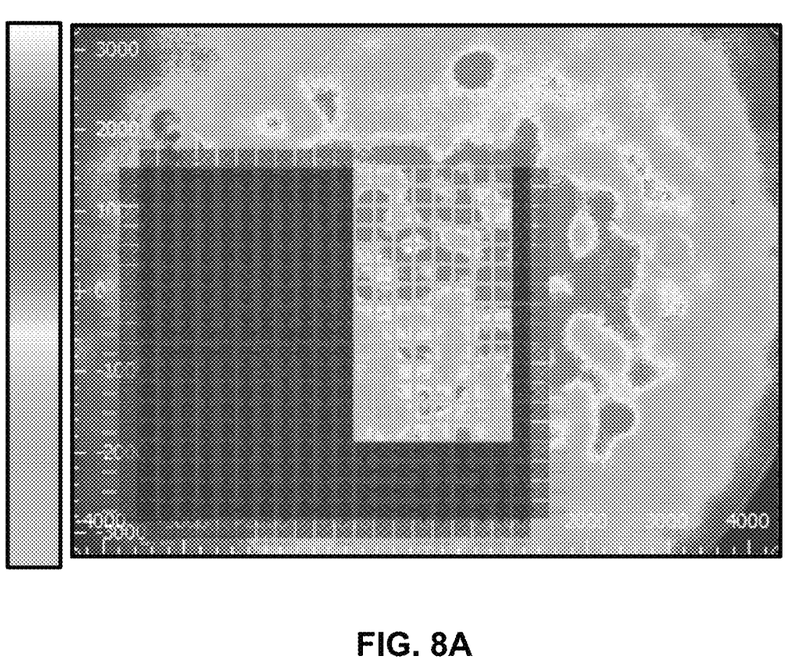
FIG. 8A shows the mottled illumination pattern from a collimated optical fiber on a 112-diode serpentine array.
Figure 8B:
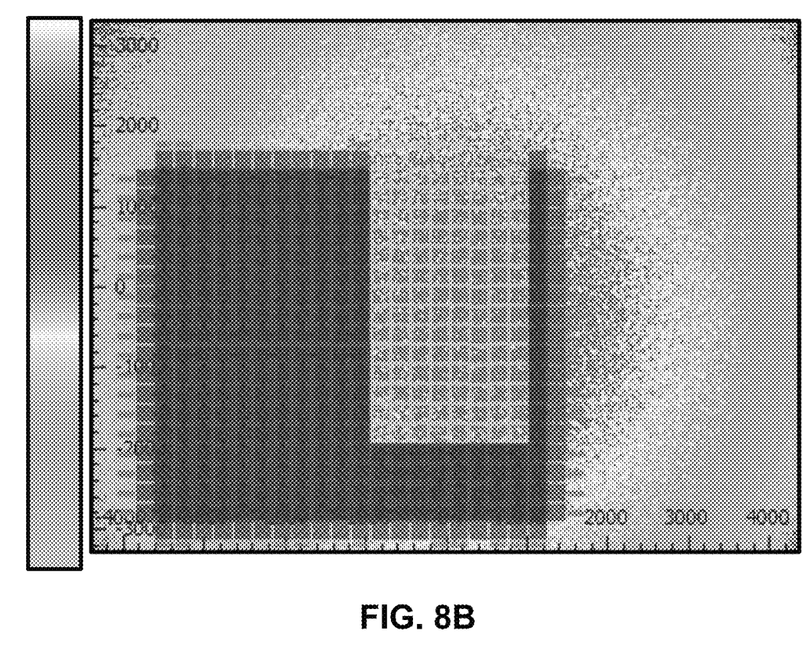
FIG. 8B shows the uniform illumination pattern on the array after the fiber output is homogenized through a ground glass diffuser.
Figure 9A:
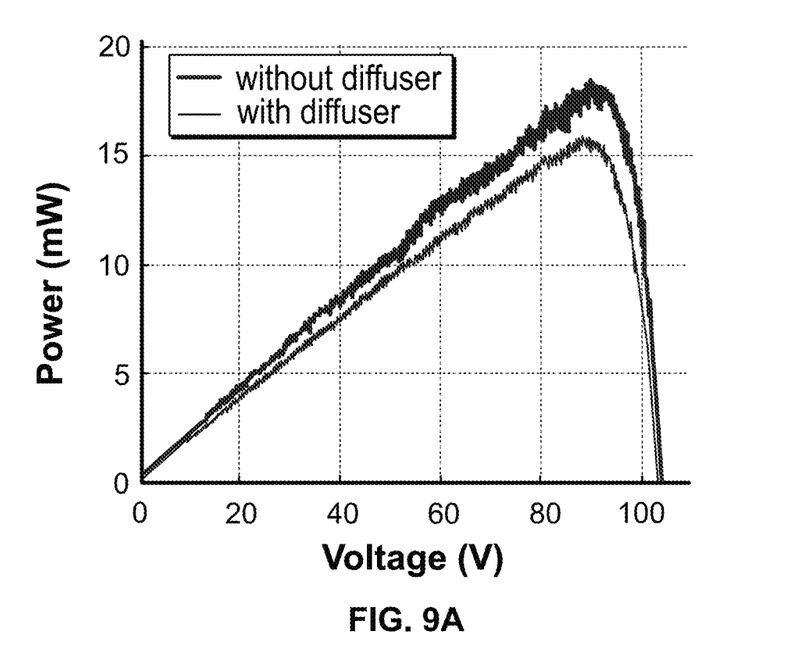
FIGS. 9A and 9B are graphs of the power and current for the 112-diode serpentine array illuminated with 808 nm light with and without the ground glass diffuser.
Figure 9B:
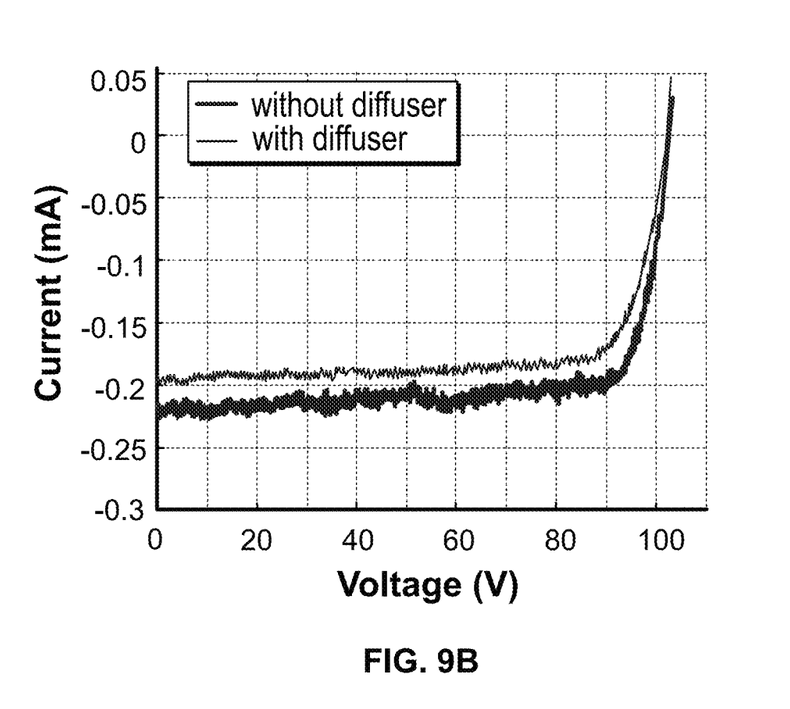

The invention can further comprise an optical device to diffuse or homogenize the laser beam before it illuminates the transparent substrate. This can be a commercial ground glass plate that is positioned in between the incident fiber optic and the transparent substrate. FIG. 8A is an image of the mottled illumination pattern of a collimated fiber output on the serial 112-diode serpentine array shown in FIG. 5. The illumination intensity is very irregular over the area of the PV array. FIG. 8B shows an illumination pattern after the fiber output has been homogenized through a ground glass diffuser. The illumination intensity is much more uniform over the area of the PV array. FIGS. 9A and 9B are graphs of the power and current for the 112-diode serpentine array illuminated with 808 nm light with and without the diffuser. When operated in series, the 112-diode array produces greater than 200 μA of current at greater than 90 V.

Figure 10:
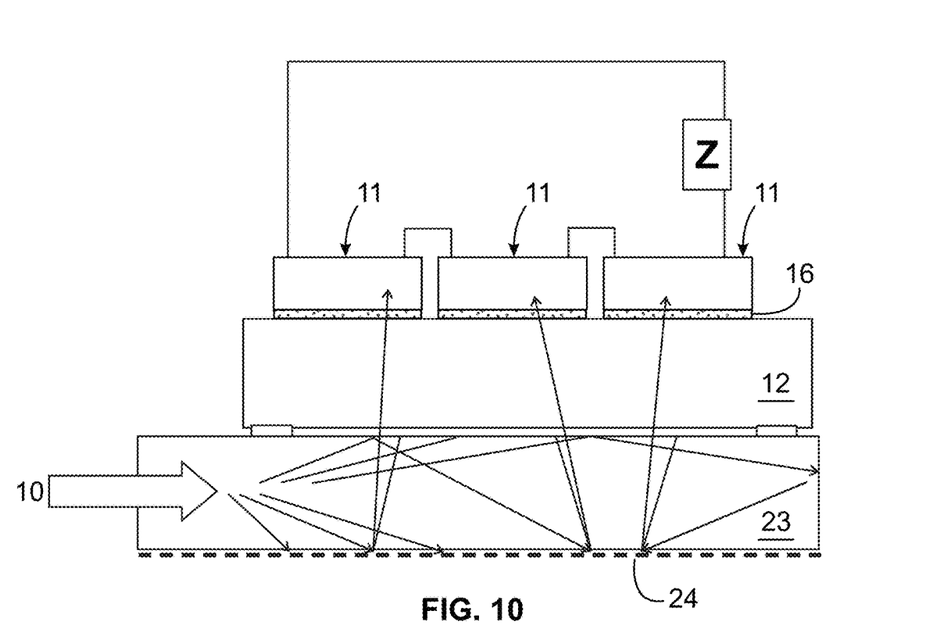
FIG. 10 is a side-view schematic illustration of a PV diode array bonded to a sapphire substrate and optically coupled to a light distribution plate (LDP). The PV diode array is uniformly illuminated through the transparent substrate via an LDP that is edge-illuminated by multi-mode laser light delivered via optical fibers.

As illustrated in FIG. 10, the invention can further comprise a light distribution plate (LDP) 23, that can be edge-illuminated by multi-mode optical fibers conducting power from multi-mode laser diodes to evenly illuminate the individual PV diodes 11 of the 2D array. See U.S. Provisional Application No. 62/769,376, filed Nov. 19, 2018, which is incorporated herein by reference. Each laser diode can provide optical power on the order of hundreds of milliwatts to several watts to the edge of the LDP 23. The LDP 23 couples the light 10 from the optical fibers, transports the input-coupled light down its length, and output couples scattered light in the direction of the PV array. The input-coupled light 10 travels in the light guide 23 due to total internal reflection and, due to the presence of a scattering structure 24 on the bottom surface of the light guide 23, is scattered through the transparent substrate 12 toward the array of PV diodes 11 on the top surface. The LDP is compact and optically efficient in distributing the directional light from the laser light sources uniformly over the large area of the PV diode array on the top surface. The illuminated PV array then converts the optical power of the output-coupled light from the LDP to electrical power. The electrical interconnection of the PV diodes combined with the power of the input optical beam establishes the power output to an attached load Z. The edge-illuminated LDP can provide a high efficiency in a small form factor.

Figure 11:
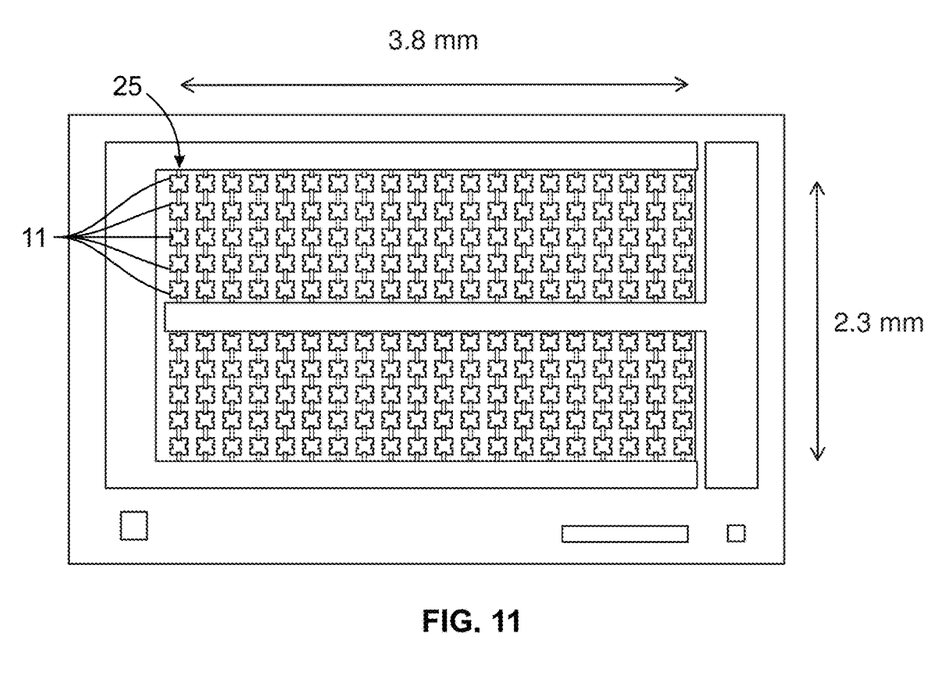
FIG. 11 is a top-view illustration of a series-parallel array comprising 40 parallel diode strings, with each string comprising a chain of 5 diodes connected in series.

It is possible to boost both the output voltage and current by the series-parallel connections of PV diodes. Stacking the PV diodes in series sums the voltage at the output, whereas stacking the PV diodes in parallel sums the current at the output. FIG. 11 shows a schematic illustration of a series-parallel array comprising 40 parallel diode strings 25, with each parallel string comprising a chain of 5 diodes 11 connected in series, for a total of 200 interconnected diodes.

Figure 12A:
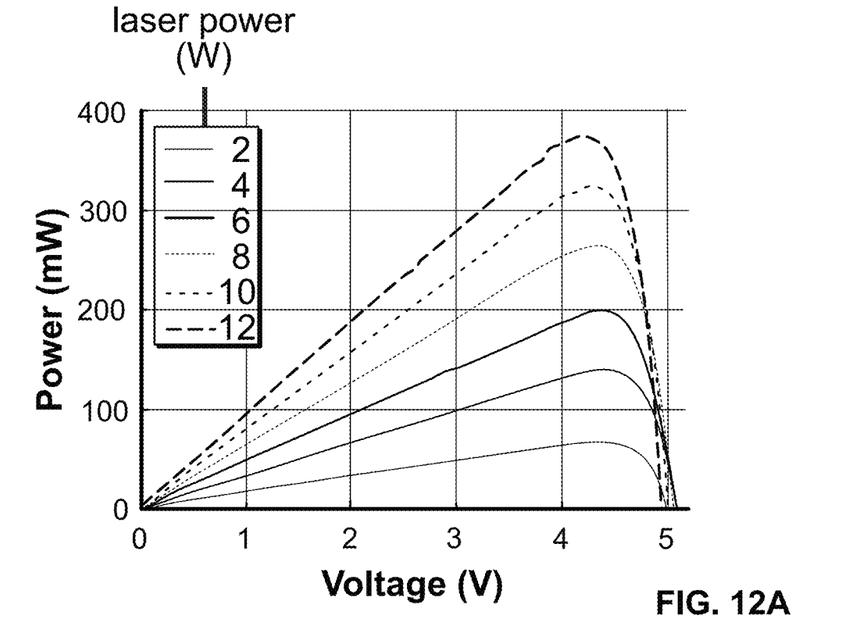
FIG. 12A is a graph of array power versus voltage for the series-parallel array for illumination with 808 nm laser for a range of laser powers.
Figure 12B:
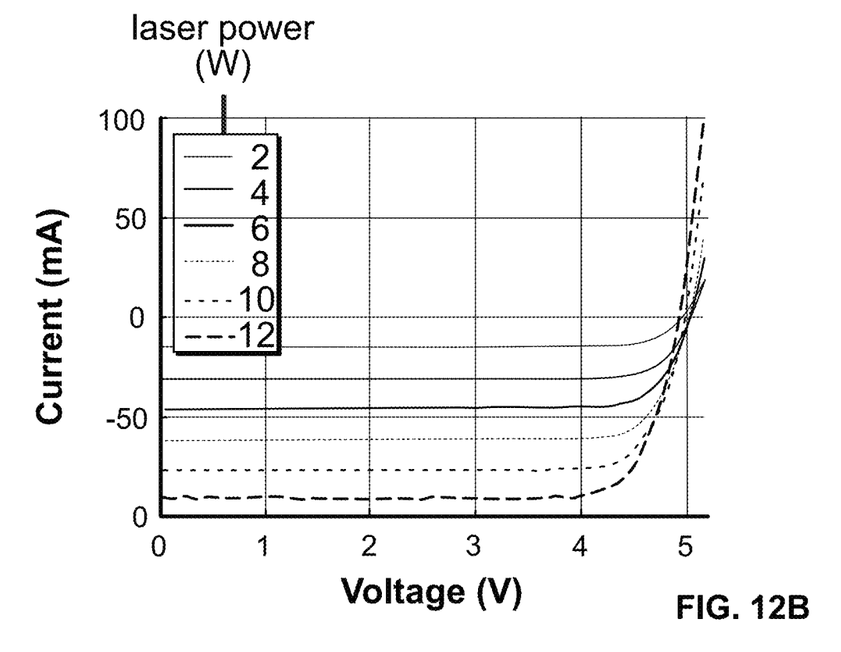
FIG. 12B is a graph of current versus voltage for the same array.

FIG. 12A is a graph of power versus voltage for the series-parallel array for illumination with 808 nm laser light at laser powers ranging from 2 to 12 watts. FIG. 12B is a graph of current versus voltage for the same array. The array generated a current of 92 mA. However, the laser beam spot was about 2.86 times larger than the size of the 3.8 mm×2.3 mm array. Therefore, the array could generate about 260 mA of current if it were sized to the laser beam spot.

Figure 13A:
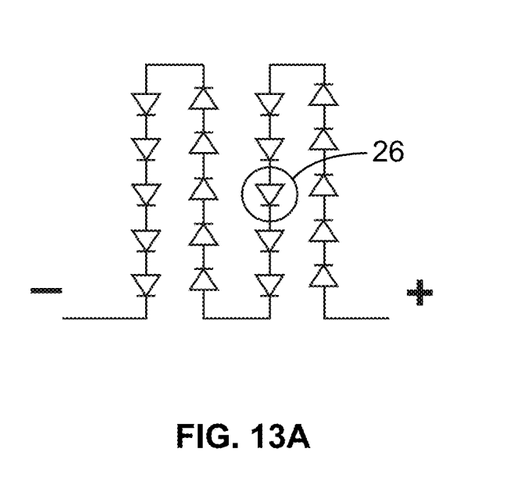
FIG. 13A is a schematic illustration of two folded series diode loops, wherein one of the loops has a faulty diode.
Figure 13B:
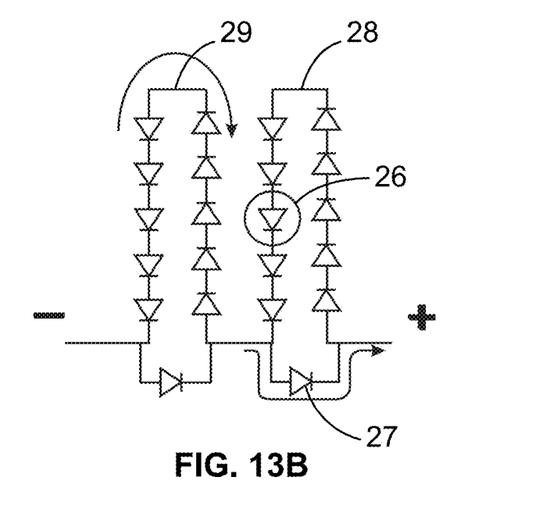
FIG. 13B is a schematic illustration of two folded series diode loops, wherein each of the loops has a bypass diode wired in parallel across the open end of the loop to shunt current around a loop having a faulty diode.

The PV diode circuit can be designed for fault tolerance. For maximum efficiency, each diode in a series-connected chain of PV diodes must behave the same as the others (i.e., each of the diodes ideally behaves as an identical current source). Since the photocurrent of a PV diode is proportional to the light that is incident on the diode, if one diode of a series connected chain receives a low light level or is otherwise faulty, the entire series chain has a low current. Therefore, current through a series of PV diodes is limited by the resistance, or bias condition, of the highest resistance diode. When a diode 26 is poorly illuminated or weak, as shown in FIG. 13A, its resistance to the flow of current will increase, limiting the overall current in the series diode chain. The faulty diode 26 will consume power until the total voltage builds up to a point where the faulty diode is driven into forward "turn on". A bypass diode can be used to mitigate this inefficiency and further allow for open-circuited diodes, which do not conduct current at all. As shown in FIG. 13B, a bypass diode 27 can be wired in parallel across the open end of a folded series diode loop 28 to shunt current around a loop having a faulty diode 26 that is limiting or blocking current flow through the loop 28. Under normal operating conditions, the bypass diode 27 is reversed biased and does not conduct current or have an effect on the series loop voltage or current flow. However, when the series loop 28 is severely restricted or open-circuited by a faulty diode 26, the bypass diode 27 provides a current path such that the other series loops 29 in the circuit continue to supply power, albeit at a reduced total output voltage, rather than no power at all.

Figure 14:
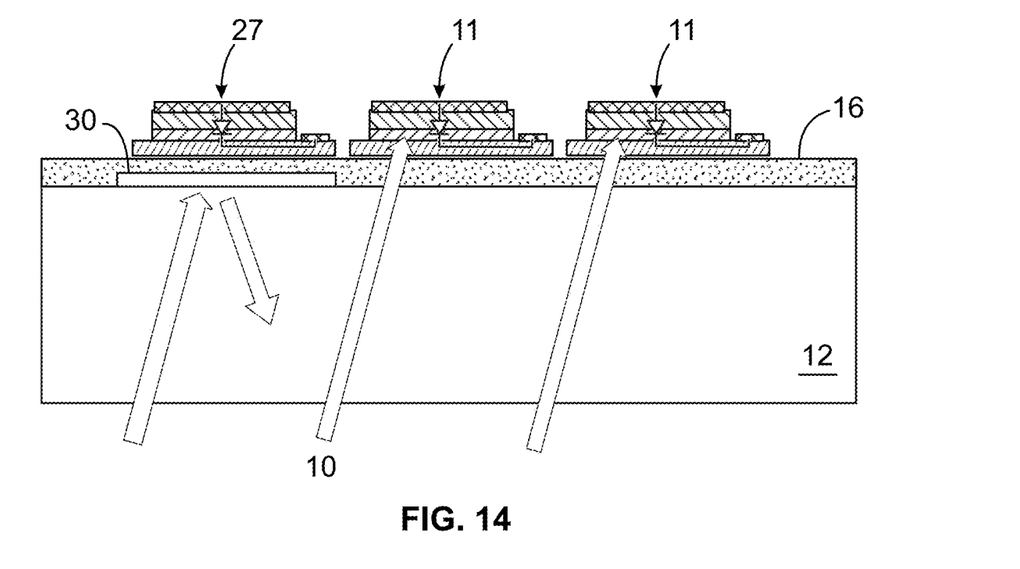
FIG. 14 is a side-view schematic illustration of PV diode array comprising a bypass diode and a light blocking layer to prevent illumination of the bypass diode and reflect light back into the transparent substrate.

However, a bypass diode will also generate a photocurrent if illuminated. Since the bypass diode is connected in reverse to the other PV diodes in the circuit, this bypass-diode-generated photocurrent would actually flow in the wrong direction, offsetting the normal photocurrent generated by the other forward-connected PV diodes in the circuit. Therefore, the bypass diode preferably does not generate photocurrent. Accordingly, an opaque blocking layer 30 can be used to block light from illuminating the bypass diode 27, as shown in FIG. 14. The figure shows three diodes bonded onto a transparent sapphire substrate with a thin BCB layer 16. Two of these diodes are bonded as normal so that light can pass through the sapphire 12 and BCB 16 to reach the PV diodes 11 and generate photocurrent. The third diode can be used as a bypass diode 27 connected in reverse, with a thin blocking layer 30 of metal on the backside. The metallic light blocking layer can be fabricated on top of the sapphire substrate 12, under the BCB bonding layer 16. The metal layer 30 can be slightly larger in area than that of the shadowed bypass diode 27. This metal layer serves to block light from entering the bypass diode, thereby preventing the generation of unwanted photocurrent in the bypass diode. The blocking layer can be thick enough to block light yet thin enough to allow successful polymer wafer bonding. For example, the BCB bonding layer can about 360 nm thick, 3 to 4 times as thick as the light blocking layer. As an example, a 90-nm thick chromium (Cr) layer can be used as the light blocking material. Chrome has the desirable properties of good adhesion to sapphire, good light reflection at 808 nm wavelength, and adequate resistance to the acid mixture used to etch away the GaAs substrate after wafer bonding. However, other metals with similar properties can also be used as the light blocking layer. The reflective properties of metals allow the blocked light to be reflected back into the sapphire substrate and an LDP (not shown), from which it can be scattered back into the PV diode array. This recycling of photons minimizes the power efficiency penalty of using the bypass diode for fault tolerance.

Figure 15:
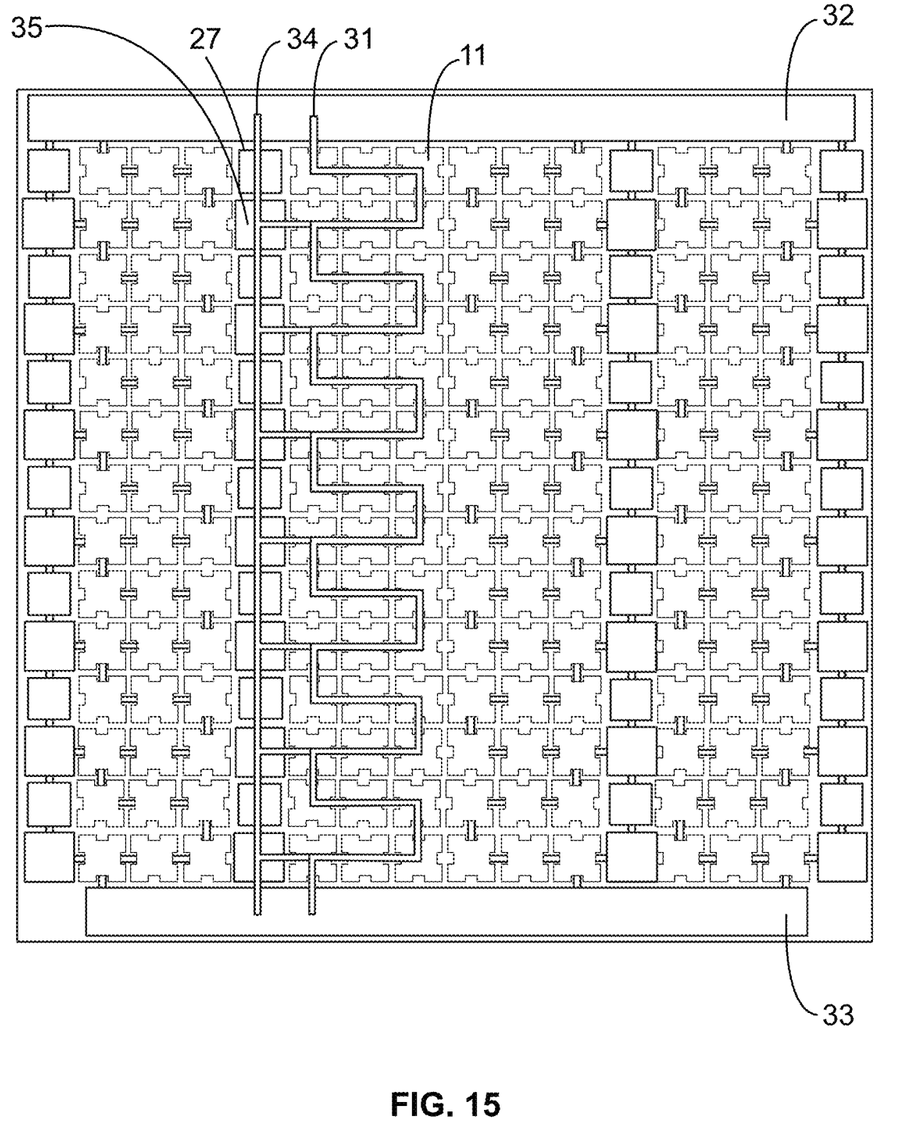
FIG. 15 is a top-view CAD image of mask layout of a series-parallel circuit comprising four series diode chains of 42 PV diodes in a string of seven folded series 6-diode loops, and the four series diode chains connected in parallel.

The method of the present invention of bonding diodes on sapphire enables the use of lithographically defined metal tabs to electrically connect the diodes in a circuit of nearly arbitrary configuration, facilitating the implementation of bypass diodes. FIG. 15 shows the mask layout of a series-parallel circuit comprising a series diode chain of 42 PV diodes in a string of seven folded series 6-diode loops. The four series diode chains are connected in parallel. The circuit will generate nominally 42 volts when illuminated. The PV diodes 11 are shown as squares. One series diode chain is highlighted with a serpentine line 31 between the two large array electrodes 32, 33 at the top and bottom, showing the zig-zag current path through the seven folded series 6-diode loops. The bypass diodes 27 are shown as squares highlighted by a straight line with forked electrodes 34 that connect the bypass circuits to the PV diode loops. Interspersed between the bypass diodes are metal squares 35 supporting electrical interconnection between the PV diode loops and the bypass diodes. The large metal interconnection squares 35 can also reflect and recycle light. Each bypass diode 27 spans a folded series diode loop comprising 6 PV diodes 11. The number of PV diodes spanned by one bypass diode is determined by the reverse breakdown voltage of the diodes. Under normal operation, the bypass diodes are forced into reverse bias by the PV diode loop. In this example, a 6-diode loop will force the bypass diode to roughly 6 Volts reverse bias. In the event that one of the PV diodes in the loop were to fail as an open circuit, the voltage on that particular loop will collapse and the loop current will be forced through the bypass diode, as described above.

The present invention has been described as a compact and efficient photovoltaic array for a power-by-light system. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A power-by-light system receiver, comprising:
a photovoltaic diode array of single-junction III-V semiconductor photovoltaic diodes on an electrically insulating, optically transparent substrate, wherein a plurality of the diodes is connected in series, wherein each of the single-junction III-V semiconductor photovoltaic diode comprises an n-type window layer on the electrically insulating, optically transparent substrate, an undoped i-type absorber layer on the n-type window layer, a p-type layer on the undoped i-type absorber layer, and a continuous p-side ohmic contact covering the p-type layer, and wherein an n-side contact is to an exposed edge of the n-type window layer and metallization between the plurality of diodes connects the n-side of one diode to the p-side ohmic contact of the next diode in the series; and
a laser or a light-emitting diode providing above-bandgap monochromatic light that illuminates the photovoltaic diode array through the electrically insulating, optically transparent substrate and wherein the photovoltaic diode array converts the monochromatic light to an electrical output.

2. The receiver of claim 1, wherein the III-V semiconductor comprises GaAs or (AlGa)As.

3. The receiver of claim 1, wherein the III-V semiconductor comprises InGaP or GaN.

4. The receiver of claim 1, wherein the n-type window layer comprises an (AlGa)As layer or a GaAs layer.

5. The receiver of claim 4, wherein the (AlGa)As layer comprises a uniform AlGaAs layer, a graded AlGaAs/GaAs layer, or an AlGaAs/GaAs bilayer.

6. The receiver of claim 1, wherein the electrically insulating, optically transparent substrate comprises sapphire.

7. The receiver of claim 1, wherein the electrically insulating, optically transparent substrate comprises glass, fused silica, polycarbonate, or GaN.

8. The receiver of claim 1, wherein the photovoltaic diode array is bonded to the electrically insulating, optically transparent substrate by an optically transparent polymer.

9. The receiver of claim 8, wherein the optically transparent polymer comprises benzocyclobutene.

10. The receiver of claim 1, wherein the plurality comprises at least one hundred diodes connected in series.

11. The receiver of claim 1, wherein the monochromatic light comprises 808 nm wavelength laser light.

12. The receiver of claim 1, wherein the photovoltaic diode array comprises a plurality of series and parallel diode circuits that most efficiently convert non-uniform illumination by the monochromatic light to electricity.

13. The receiver of claim 1, wherein the plurality of diodes connected in series generate a voltage greater than 2 V.

14. The receiver of claim 1, wherein the plurality of diodes connected in series generate a voltage greater than 1000 V.

15. The receiver of claim 14, wherein the plurality of the diodes is connected in series to form a folded series diode loop and the bypass diode is wired in parallel across an open end of the loop.

16. The receiver of claim 1, wherein the photovoltaic diode array further comprises a plurality of the diodes connected in parallel.

17. The receiver of claim 1, wherein the photovoltaic diode array is less than 10 microns in thickness.

18. The receiver of claim 1, further comprising a diffuser comprising a scattering structure that homogenizes the monochromatic light to uniformly illuminate the photovoltaic diode array through the electrically insulating, optically transparent substrate.

19. The receiver of claim 1, further comprising at least one bypass diode wired to shunt current around at least one of the photovoltaic diodes.

20. The receiver of claim 19, further comprising an opaque blocking layer to block light from illuminating the at least one bypass diode.

21. The receiver of claim 1, further comprising a light distribution plate having an edge and a length disposed on a bottom surface of the electrically insulating, optically transparent substrate, wherein the light distribution plate is edge-illuminated by the monochromatic light and wherein the light distribution plate input couples the monochromatic light, transports the input-coupled light down the length by total internal reflection, and scatters at least a portion of the input-coupled light through the electrically insulating, optically transparent substrate.

\* \* \* \* \*